United States Patent
Krishnan et al.

(10) Patent No.: US 10,266,709 B2
(45) Date of Patent: Apr. 23, 2019

(54) OFFSET CONDUCTIVE INKS AND COMPOSITIONS

(71) Applicant: SUN CHEMICAL CORPORATION, Parsippany, NJ (US)

(72) Inventors: Ramasamy Krishnan, North Brunswick, NJ (US); Mark Schneider, Paramus, NJ (US); Dan Rubik, Homer Glen, IL (US); Kacy Schultz, Batavia, IL (US); Juanita Parris, Montvale, NJ (US)

(73) Assignee: SUN CHEMICAL CORPORATION, Parsippany, NJ (US)

( * ) Notice: Subject to any disclaimer, the term of this patent is extended or adjusted under 35 U.S.C. 154(b) by 64 days.

(21) Appl. No.: 15/311,631

(22) PCT Filed: May 19, 2015

(86) PCT No.: PCT/US2015/031479
§ 371 (c)(1),
(2) Date: Nov. 16, 2016

(87) PCT Pub. No.: WO2015/179341
PCT Pub. Date: Nov. 26, 2015

(65) Prior Publication Data
US 2017/0088725 A1    Mar. 30, 2017

Related U.S. Application Data

(60) Provisional application No. 62/001,873, filed on May 22, 2014, provisional application No. 62/025,060, filed on Jul. 16, 2014.

(51) Int. Cl.
| | |
|---|---|
| C08F 2/46 | (2006.01) |
| C08F 2/50 | (2006.01) |
| C08G 61/04 | (2006.01) |
| C09D 11/101 | (2014.01) |
| C09D 5/24 | (2006.01) |
| H05K 1/09 | (2006.01) |
| C09D 11/03 | (2014.01) |
| C09D 11/037 | (2014.01) |
| H05K 1/03 | (2006.01) |
| C09D 11/104 | (2014.01) |
| C09D 11/52 | (2014.01) |
| H05K 3/12 | (2006.01) |

(52) U.S. Cl.
CPC .............. *C09D 11/101* (2013.01); *C09D 5/24* (2013.01); *C09D 11/03* (2013.01); *C09D 11/037* (2013.01); *C09D 11/104* (2013.01); *C09D 11/52* (2013.01); *H05K 1/03* (2013.01); *H05K 1/095* (2013.01); *H05K 3/1275* (2013.01); *H05K 2201/0323* (2013.01); *H05K 2201/10098* (2013.01); *H05K 2203/1163* (2013.01)

(58) Field of Classification Search
CPC ...... C09D 11/101; C09D 11/037; C09D 5/24; C09D 11/03; H05K 1/095; H05K 2201/10098; H05K 1/03; H05K 1/323
USPC ...................................... 522/81, 71, 1; 520/1
See application file for complete search history.

(56) References Cited

U.S. PATENT DOCUMENTS

| | | |
|---|---|---|
| 6,207,268 B1 | 3/2001 | Kosaka et al. |
| 2003/0045596 A1 | 3/2003 | Krohn |
| 2008/0103254 A1* | 5/2008 | Asada .................. C09D 11/101 524/832 |
| 2010/0181753 A1* | 7/2010 | Magnin ................ C09D 11/101 283/71 |
| 2012/0192735 A1 | 8/2012 | Krishnan et al. |
| 2013/0309397 A1 | 11/2013 | Breton et al. |
| 2013/0310479 A1* | 11/2013 | Lee ...................... C09D 11/101 522/18 |

FOREIGN PATENT DOCUMENTS

| | | |
|---|---|---|
| DE | 4011867 A1 | 10/1991 |
| EP | 0711671 A1 | 5/1996 |
| JP | 2006/282982 A | 10/2006 |

OTHER PUBLICATIONS

Goodrich, Evaluation of New Oligomers for UV/EB lithographic Inks, Sartomer Company, 2010 (Year: 2010).*
Notification Concerning Transmittal of the International Preliminary Report on Patentability Chapter 1 of the Patent Cooperation Treaty) issued in International Application No. PCT/US2015/031479, dated Dec. 1, 2016.
International Search Report issued in International Application No. PCT/US15/31479, dated Aug. 10, 2015.
Written Opinion of the International Searching Authority issued in International Application No. PCT/US15/31479, dated Aug. 10, 2015.
European Patent Application 15 79 6011 dated Apr. 5, 2017.

* cited by examiner

*Primary Examiner* — Jessica Whiteley
(74) *Attorney, Agent, or Firm* — Charles C. Achkar; Ostrolenk Faber LLP

(57) ABSTRACT

The present invention is directed to energy curable offset conductive inks and hybrid offset conductive ink compositions that contain an oxidative curable ink and the energy curable offset conductive ink. The conductive inks and ink compositions exhibit low levels of resistance and hence have superior conductivity.

23 Claims, No Drawings

OFFSET CONDUCTIVE INKS AND COMPOSITIONS

CROSS REFERENCE TO RELATED APPLICATIONS

The present application is a § 371 National Phase application based on PCT/US2015/031479 filed May 19, 2015, which claims the benefit of U.S. Provisional Patent Application Ser. No. 62/001,873 filed May 22, 2014, and to U.S. Provisional Patent Application Ser. No. 62/025,060 filed Jul. 16, 2014 all of which are incorporated herein by reference in their entirety and for all purposes.

FIELD OF THE INVENTION

The present invention is directed to energy curable offset conductive inks and hybrid offset conductive ink compositions that contain an oxidative curable ink and the energy curable offset conductive ink. The inks and ink compositions exhibit low levels of resistance and hence have superior conductivity.

BACKGROUND OF THE INVENTION

Conductive inks have been used in various printing techniques such as for example flexographic printing, gravure printing and ink jet printing and have been used in a number of applications, such as printing electronic components for example antennae for radio frequency identification (RFID) devices.

U.S. Pat. No. 7,001,667 is directed to alkyd-based free radical wood coating compositions comprising a polymer with an alkyd portion and a free radical curable portion. The composition is particularly useful for coating wood substrates.

US 2010/0170616 is directed to electrically conductive tape for walls and ceilings having a conductive composition which may be a conductive ink which contains silver and/or copper.

U.S. Pat. No. 6,641,860 is directed to a method of manufacturing circuit boards by applying conductive inks to substrates wherein the ink may be a ultra violet (UV) cured offset ink.

US 2010/0140564 is directed to conductive inks which may contain a radiation curable material that is preferably a monofuntional or multifunctional (meth)acrylate monomer and at least one polyurethane.

US 2010/0129710 is directed to lithographically printed cells wherein a silver loaded conductive ink is lithographically printed onto a cathode substrate wherein the conductive ink contains a polymeric resin.

Finally CN 2012/10391958 is directed to a thermal-ultraviolet dual curing water-based colored coating composition which contains a water-soluble polyfunctional acrylate monomer.

SUMMARY OF THE INVENTION

The present invention provides a conductive ink comprising at least one oligomer, at least one monomer, at least one conductive pigment, optionally at least one photoinitiator and optionally at least one dispersant and wherein the ink is an energy curable offset ink with a dynamic viscosity of at least 40 Pa·s.

Furthermore the present invention also provides a hybrid offset conductive ink composition comprising oxidative curable ink and the energy curable offset conductive ink.

Additionally the present invention provides a substrate comprising the energy curable offset conductive ink or the hybrid offset conductive ink composition on a surface of the substrate.

Finally the present invention provides a method of providing a substrate with a conductive ink or composition on a surface thereof comprising
 a) applying a conductive ink or composition onto a surface of the substrate and
 b) drying the conductive ink or composition.

These and other objects, advantages, and features of the invention will become apparent to those persons skilled in the art upon reading the details of the methods and formulations as more fully described below.

DETAILED DESCRIPTION OF THE INVENTION

It has been found that the offset conductive inks and compositions according to the present invention when applied to an article or substrate exhibit low levels of resistance and hence increased conductivity which has not been previously attained using offset printing.

A conductive ink is an ink that when in the form of a dry film is electrically conductive. However, the ink when wet may also be electrically conductive. Typically the conductive ink provides a surface electrical resistance of less than 1000 ohms/square when measured using a direct current.

The energy curable offset conductive ink usually comprises between 10 to 75 wt % oligomer, preferably between 20 to 50 wt % and advantageously between 25 to 35 wt %.

Preferably the oligomer is a fatty acid modified polyester acrylate such as a fatty acid modified polyester hexaacrylate or an epoxidized soya oil acrylate, and advantageously the conductive ink comprises both a fatty acid modified polyester hexaacrylate and an epoxidized soya oil acrylate.

Typically the conductive inks contain between 25 to 40 wt % monomer, preferably between 10 to 35 wt % and advantageously between 20 to 25 wt %.

The monomers are preferably monofunctional ethylenically unsaturated monomers or multifunctional ethylenically unsaturated monomers.

Examples of suitable monofunctional ethylenically unsaturated monomers include 2(2-ethoxyethoxy) ethyl acrylate, 2-phenoxyethyl acrylate, 2-phenoxyethyl methacrylate, $C_{12}$-$C_{14}$ alkyl methacrylate, $C_{16}$-$C_{18}$ alkyl acrylate, $C_{16}$-$C_{18}$ alkyl methacrylate, caprolactone acrylate, cyclic trimethylolpropane formal acrylate, ethoxylated (4) nonyl phenol acrylate, isobornyl acrylate, isobornyl methacrylate, isodecyl acrylate, lauryl acrylate, methoxy polyethylene glycol (350) monomethacrylate, octyldecyl acrylate, polypropylene glycol monomethacrylate, stearyl acrylate, tetrahydrofurfuryl acrylate, tetrahydrofurfuryl methacrylate, and tridecyl acrylate.

Examples of suitable polyfunctional ethylenically unsaturated monomers include 1,3-butylene glycol dimethacrylate, 1,4-butanediol dimethacrylate, 1,6 hexanediol diacrylate, 1,6 hexanediol dimethacrylate, alkoxylated diacrylate, diethylene glycol dimethacrylate, dipropylene glycol diacrylate, ethoxylated (10) bisphenol A diacrylate, ethoxylated (2) bisphenol A dimethacrylate, ethoxylated (3) bisphenol A diacrylate, ethoxylated (3) bisphenol a dimethacrylate, ethoxylated (4) bisphenol A diacrylate, ethoxylated (4) bisphenol A dimethacrylate, ethoxylated bisphenol A dimethacrylate, ethoxylated (10) bisphenol dimethacrylate, ethylene glycol dimethacrylate, polyethylene glycol (200) diacrylate, polyethylene glycol (400) diacrylate, polyethylene glycol (400) dimethacrylate, polyethylene glycol (400) dimethacrylate, polyethylene glycol (600) diacrylate, polyethylene glycol (600) dimethacrylate, polyethylene glycol 400 diacrylate, propoxylated (2) neopentyl glycol diacrylate, tetraethylene glycol diacrylate, tetraethylene glycol dimethacrylate, tricyclodecane dimethanol diacrylate, tricyclodecanedimethanol dimethacrylate, triethylene glycol diacrylate, triethylene glycol dimethacrylate, tripropylene glycol diacrylate, ethoxylated (15) trimethylolpropane triacrylate, ethoxylated (3) trimethylolpropane triacrylate, ethoxylated (6) trimethylolpropane triacrylate, ethoxylated (9) trimethylolpropane triacrylate, ethoxylated (5) pentaerythritol triacrylate, ethoxylated (20) trimethylolpropane triacrylate, propoxylated (3) glyceryl triacrylate, trimethylolpropane triacrylate, propoxylated (5.5) glyceryl triacrylate, pentaerythritol triacrylate, propoxylated (3) glyceryl triacrylate, propoxylated (3) trimethylolpropane triacrylate, trimethylolpropane triacrylate, trimethylolpropane trimethacrylate, tris (2-hydroxy ethyl) isocyanurate triacrylate, di-trimethylolpropane tetraacrylate, dipentaerythritol pentaacrylate, ethoxylated (4) pentaerythritol tetraacrylate, pentaerythritol tetraacrylate and dipentaerythritol hexaacrylate.

Preferably the monomer is dipentaerythritol pentaacrylate.

In a preferred embodiment of the invention the monomer is selected from propoxylated neopentyl glycol (meth)acrylate and propoxylated neopentyl glycol diacrylate (PONPGDA).

Advantageously the conductive ink comprises both dipentaerythritol pentaacrylate and PONPGDA.

Advantageously the monomer is linseed oil compatible.

The conductive inks also typically contain between 5 to 40 wt % of conductive pigment, preferably between 10 to 35 wt % and advantageously between 20 to 30 wt %.

The conductive pigment may include any conductive pigments such as coated and uncoated metallic conductive pigment which typically comprises silver, gold, palladium, aluminum and/or graphite.

In a preferred embodiment of the present invention the conductive pigment is carbon black which can be used alone or in combination with any other conductive pigments.

When the conductive ink contains a photoinitiator this is usually present in the amount of between 0.5 to 25 wt % and preferably between 5 to 20 wt % of photoinitiator.

Suitable photoinitiators include α-hydroxyketones such as 1-hydroxy-cyclohexyl-phenyl-ketone, 2-hydroxy-2-methyl-1-phenyl-1-propanone, 2-hydroxy-1-{4-[4-(2-hydroxy-2-methyl-propionyl)-benzyl]-phenyl}-2-methyl-propan-1-one and 2-hydroxy-1-[4-(2-hydroxyethoxy)phenyl]-2-methyl-1-propanone; acylphosphine oxides such as 2,4,6-trimethylbenzoyl-diphenylphosphine oxide, 2,4,6-trimethylbenzoyl-diphenyl phosphinate, bis(2,4,6-trimethylbenzoyl)-phenylphosphineoxide, α-aminoketones such as 2-methyl-1[4-(methylthio)phenyl]-2-morpholinopropan-1-one and 2-benzyl-2-dimethylamino-1-(4-morpholinophenyl)-butanone-1; 2-dimethylamino-2-(4-methylbenzyl)-1-(4-morpholin-4-yl-phenyl)-butan-1-one.

Other suitable photoinitiators include benzil dimethyl ketal; methyl benzoylformate, 1-phenyl-1,2-propanedione-2-(o-ethoxycarbonyl)oxime, 4,4,4-(hexyamethyltriamino) triphenyl methane, 2-benzyl-2-dimethylamino-4-morpholinobutyrophenone, 2-methyl-1-(4-methylthiophenyl)-2-morpholineopropan-1-one, 4,4-bis(diethylamino) benzophenone, 2-ethyl anthraquinone; thioxantone initiators such as 2-4-diethylthioxanthone, isopropylthioxanthone, 2-chlorothioxanthone and 1-chloro-4-propoxythioxanthone; benzophenone initiators such as benzophenone, 4-phenylbenzophenone, 4-methylbenzophenone, methyl-2-benzoylbenzoate and 4-benzoyl-4-methyldphenyl sulphide; phenylglyoxylate initiators such as phenyl glyoxylic acid methyl ester, oxy-phenyl-acetic acid 2-[2-hydroxy-ethoxy]-ethyl ester and oxy-phenyl-acetic acid 2-[2-oxo-2-phenyl-acetoxy-ethoxy]-ethyl ester; titanocene radical initiators such as titanium bis(η5-2,4-cyclopentadien-1-yl)bis[2,6-difluoro-3-(1h-pyrrol-1-yl)phenyyl]; and oxime ester radical initiators such as [1-(4-phenylsulfanylbenoyl)heptylideneamino]benzoate or [1-[9-ethyl-6-(2-methylbenzoyl)carbazol-3-yl]ethylideneamino]acetate.

The photoinitiators may also be polymeric photoinitiators such as polymeric aminobenzoates (Genopol AB-1 from Rahn, Omnipol TX from IGM or Speedcure 7040 from Lambson), polymeric benzophenone derivatives (Genopol BP-1 from Rahn, Omnipol BP from IGM or Speedcure 7005 from Lambson), and polymeric thioxanthone derivatives (Genopol TX-1 from Rahn, Omnipol TX from IGM or Speedcure 7010 from Lambson).

When the conductive ink contains a dispersant this is usually present in the amount of between 0.5 to 3 wt % and preferably between 1 to 2 wt %.

The dispersant is typically polyester based and is advantageously a polyester based block copolymer such as BYK 9077.

The conductive inks, in addition to the conductive pigments, may include other colorants including organic or inorganic pigments and/or dyes.

Suitable dyes may include azo dyes, anthraquinone dyes, xanthene dyes, azine dyes, and combinations thereof.

Suitable organic or inorganic pigments include iron oxide, chromium oxide, ferric ammonium ferrocyanids, ferric oxide black, Pigment Black Number 7, Pigment White Numbers 6 and 7, carbon black, zinc oxide, titanium dioxide, phthalocyanine, anthraquinones, perylenes, carbazoles, monoazo and disazobenzimidazoles, rhodamines, indigoids, quinacridones, diazopyranthrones, dinitranilines, pyrazoles, diazopyranthrones, dinityanilines, pyrazoles, dianisidines, pyranthrones, tetracholoroisoindolines, dioxazines, monoazoacrylides and anthrapyrimidines, Pigment Yellow Numbers 12, 13, 14, 17, 74, 83, 114, 126, 127, 174, 188; Pigment Red Numbers 2, 22, 23, 48:1, 48:2, 52, 52:1, 53, 57:1, 112, 122, 166, 170, 184, 202, 266, 269; Pigment Orange Numbers 5, 16, 34, 36; Pigment Blue Numbers 15, 15:3, 15:4; Pigment Violet Numbers 3, 23, 27; and Pigment Green Number 7.

Finally other suitable commercial organic pigments may be incorporated into the conductive ink which include those classified according to Color Index International according to the following trade designations such as blue pigments PB1, PB15, PB15:1, PB15:2, PB15:3, PB15:4, PB15:6, PB16 and PB60; brown pigments PB5, PB23, and PB265; green pigments PG1, PG7, PG10 and PG36; yellow pigments PY3, PY14, PY16, PY17, PY24, PY65, PY73, PY74 PY83, PY95, PY97, PY108, PY109, PY110, PY113, PY128, PY129, PY138, PY139, PY150, PY151, PY154, PY156, PY175, PY180 and PY213; orange pigments PO5, PO15, PO16, PO31, PO34, PO36, PO43, PO48, PO51, PO60, PO61 and PO71; red pigments PR4, PR5, PR7, PR9, PR22, PR23, PR48, PR48:2, PR49, PR112, PR122, PR123, PR149, PR166, PR168, PR170, PR177, PR179, PR190, PR202, PR206, PR207, PR224 and PR254: violet pigments PV19, PV23, PV32, PV37 and PV42 and black pigments.

The conductive inks may also contain one or more further additives selected from the group consisting of adhesion promoters, light stabilizers, de-gassing additives, flow promoters, defoamers, antioxidants, UV stabilizers, surfactants, plasticizers, rheological additives, waxes, and silicones.

Suitable defoamers can also include TEGO FOAMEX N, FOAMEX 1488, 1495, 3062, 7447, 800, 8030, 805, 8050, 810, 815N, 822, 825, 830, 831, 835, 840, 842, 843, 845, 855, 860, 883, TEGO FOAMEX K3, TEGO FOAMEX K7/K8 and TEGO TWIN 4000 available from Evonik industries and BYK-066N, 088, 055, 057, 1790, 020, BYK-A 530, 067A and BYK 354 available from BYK.

Additionally, the conductive inks may further comprise at least one amine synergist.

Suitable amine synergists include ethyl-4-(dimethlamino)benzoate, 2-ethylhexyl-4-(dimethylamino)benzoate, 2-(dimethylamino)ethylbenzoate, poly[oxy(methyl 1,2-ethanediyl)], α-[4-(dimethylamino)benzoyl-α-butoxy, butoxyethyl-4-(dimethylamino)benzoate, whilst commercial amine synergists include Ebecryl 80/81/83, Ebecryl LEO 10551/10552/10553, Ebecryl 7100 and Ebecryl p116 available from Cytec; CN501, 503, 550, CN UVA421, CN341, 3705, 3715, 3735, 3755, 381, 384, 584, 554 available from Sartomer; Genomer 5142, 5161, 5275 available from Rahn; Photomer 4771, 4779F, 4967F, 4968F, 5006F, 4775F, 5960F, Laromer LR8996, Laromer PO94F and Laromer PO77F available from BASF; Omnirad CI-250 and Omnilane A1230C available from IGM resins and Desmolux VPLS 2299 from Bayer coatings.

The conductive inks may further contain at least one suitable de-aerator, which prevents the formation of air inclusions and pinholes in the cured coating. Examples of suitable commercial de-aerators include TEGO Airex900, 910, 916, 920, 931, 936, 940, 944, 945, 950, 962, 980 and 986 available from Evonik industries.

Finally the conductive inks may include surface control additives which control the surface tension of the ink and control the level of slip and scratch resistance of the coating. Examples of suitable surface control additives include TEGO Flow300, 370, 425, TEGO Glide100, 110, 130, 406, 410, 411, 415, 420, 432, 435, 440, 482, A115, B1484, TEGO Glide ZG 400, TEGO RAD2010, 2011, 2100, 2200N, 2250, 2300, 2500, 2600, 2650, 2700, TEGO Twin 4000, 4100, TEGO Wet 240, 250, 260, 265, 270, 280, 500, 505, 510 and TEGO wet KL245 available from Evonik industries; BYK 333,337, BYK UV3500, BYK 378, 347, 361, BYK UV3530, 3570, Cerflour 998, 996, Nanobyk 3601, 3610, 3650 and Cermat 258 available from BYK; Ebecryl 350, 1360, Modaflow 9200, Ebecryl 341 available from Cytec and an aliphatic silicone acrylate CN9800 available from Sartomer.

The present invention also provides a hybrid offset conductive ink composition comprising an oxidative curable ink and the energy curable offset conductive ink.

The hybrid offset conductive ink composition my contain up to 35 wt % energy curable offset conductive ink and may contain up to 35 wt % of an oxidative curable ink.

The hybrid offset conductive ink composition may have a weight ratio of energy curable offset conductive ink to oxidative curable ink of 5:95, 10:90, 20:80, 30:70, 40:60, 50:50, 60:40, 70:30, 80:20, 90:20 or 95:5.

The oxidative curable ink may be any commercial oxidative curable ink and advantageously the pigment present in the oxidative curable ink is replaced with a conductive pigment such as conductive carbon black.

The energy curable offset conductive inks and the hybrid offset conductive ink compositions typically have a dynamic viscosity of between 40 to 100 Pa·s.

Additionally the conductive inks and compositions are preferably lithographic conductive inks or compositions.

The conductive inks and compositions are typically applied to substrates using offset printing and advantageously lithographic printing and the substrates may include paper, board, wood, metal and plastic.

The conductive inks and compositions are preferably dryed/cured using a ultraviolet (UV) radiation although other forms of energy cure may be used, for example electron beam, infra-red or any other actinic light source.

In another embodiment the invention provides a multi-layer print containing a printed circuit comprising
 a) at least one layer of a conductive ink;
 b) at least one layer of a hybrid offset conductive ink composition according to the present invention;
 c) at least one layer of a colored ink and
 d) at least one layer of graphics.

Preferably, the conductive ink is an energy curable offset conductive ink according to the present invention.

However, advantageously the conductive ink is a water-based lithographic printed conductive ink.

Preferably the colored ink is a silver colored energy curable offset ink, which is typically used to mask the underlying printed circuit.

The multi-layer print also advantageously comprises at least one further colored ink which is preferably an opaque white energy curable offset ink.

Finally the layer of graphics is either printed as solid colors or 4-color process printed, and is preferably printed as an energy curable offset ink.

Finally, in a further embodiment the present invention provides a system comprising
 a) an information carrier capable of encoding information comprising a dielectric and/or conductive pattern provided by an energy curable offset conductive ink or a hybrid offset conductive ink and
 b) a detection device capable of decoding information comprising a capacitive touch screen.

Usually the information is decoded upon the interaction of the pattern and the capacitive touch screen and typically the interaction, is induced by relative motion between the information carrier and the touch screen which generates a touch signal due to the difference in the dielectric coefficient and/or the conductivity of the pattern and the touch screen.

The invention is further described by the examples given below.

EXAMPLES

The following examples illustrate specific aspects of the present invention and are not intended to limit the scope thereof in any respect and should not be so construed.

Example 1. Energy Curable Offset Conductive Ink

Table 1 sets out the components present in a conductive ink according to the present invention.

TABLE 1

| Material | wt % | Typical Range |
|---|---|---|
| Ebecryl 450-Oligomer (Allnex) | 25.5 | 10-50% |
| SR399 DPPA-Monomer (Sartomer) | 12 | 0-20% |
| Florstab UV-1-UV stabilizer (Environ) | 2.5 | 0-5% |

TABLE 1-continued

| Material | wt % | Typical Range |
|---|---|---|
| Photomer 3005-Epoxidized soya oil acrylate oligomer (IGM) | 5 | 1-25% |
| Photoinitiator blend | 17 | 0.5-25% |
| BYK 9077-Dispersant (BYK) | 1.5 | 0-3% |
| Photomer 4127 (PONPGDA)-Monomer (IGM) | 11 | 0-20% |
| Ethoxylated castor oil | 0.5 | 0-5% |
| VXC605-Conductive carbon black (Cabot) | 25 | 0-40% |
| Total | 100.00 | |

The conductive ink of table 1 was used to prepare prints as follows:

The prints were made using an IGT 800N proofer positioned onto an uncoated side of a 0.078 pt solid bleached sulphate (SBS) virgin fiber grade board.

The conductive ink was applied to the board and the prints were cured using a UV lab unit outfitted with a 300/wpi high Hg lamp at 150/fpm.

Finally the ink density was determined using an X-Rite 500 series Spectrodensitometer.

The conductivity of the printed ink was then measured using a Fluke 289 Multimeter and the conductivity of the printed substrate was measured with the probes set at a fixed distance of one centimeter. The results are set out in table 2.

TABLE 2

| Ink Density | |
|---|---|
| 1 print layer | 1.15 |
| 2 print layers | 1.37 |
| Immediate Conductivity Response (within 1 hour) | |
| 1 print layer | no response |
| 2 print layers | 224.3M |
| After 1 day | |
| 1 print layer | 66.9M |
| 2 print layers | 12.17M |
| After 2 days | |
| 1 print layer | 18.76M |
| 2 print layers | 8.75M |
| After 3 days | |
| 1 print layer | 10.51M |
| 2 print layers | 1.71M |
| After 4 days | |
| 1 print layer | 5.31M |
| 2 print layers | .473M |
| After 7 days | |
| 1 print layer | 3.97M |
| 2 print layers | 475.41K |
| After 11 days | |
| 1 print layer | 3.62M |
| 2 print layers | 148.72K |

Response Key: M = megaohm, K = kilohm

Lower resistance values equate to higher conductivity. Thus, for the inks of the present invention, lower resistance values (i.e. higher conductivity) are favorable. A non-conductive ink would exhibit none or a minimal conductivity response. The results in table 2 indicate that the Example 1 ink exhibits increased conductivity with multiple print layers and increased conductivity upon aging.

Depending on the end-use conductivity requirements, the inks of the present invention will be immediately functional with 2 print layers, and functional after 1 day with a single print layer. However, prints made with the inks of the present invention are preferably allowed to age before use to allow the conductivity values to become more robust.

Example 2. An Hybrid Offset Conductive Ink Composition is Set Out in Table 3

Sun Chemical SFN90009 oxidative drying black sheetfed offset conductive ink was used in combination with the energy curable offset conductive ink of example 1 to provide a conductive ink composition according to the present invention.

Table 3 shows the resistance values for Examples 2A-2C which have been printed on an uncoated side of 0.078 pt SBS board.

Example 2A contains 100% oxidative curable ink, Example 2B is a hybrid offset conductive ink composition according to the present invention containing a 75:25 blend of the oxidative curable ink to the conductive ink of Example 1 and Example 2C contains 100% conductive ink of Example 1.

TABLE 3

| | Example 2A (comparative) | Example 2B (inventive) | Example 2C (inventive) |
|---|---|---|---|
| Oxidative curable ink | 100 | 75 | 0 |
| Conductive ink of Example 1 | 0 | 25 | 100 |
| Total | 100 | 100 | 100 |
| Ink Density | | | |
| 1 hit | 1.15 | 1.34 | 1.34 |
| 2 hits | 1.37 | 1.42 | 1.54 |
| Resistance Values (1 Hr.) | | | |
| 1 hit | no response | no response | 32.11M |
| 2 hits | 224.3M | 125.6M | 13.06M |
| Resistance Values (1 Day) | | | |
| 1 hit | 66.9M | 16.23M | 21.49M |
| 2 hits | 12.17M | 0.671M | 7.76M |
| Resistance Values (2 Days) | | | |
| 1 hit | 18.76M | 6.63M | 15.35M |
| 2 hits | 8.75M | 387.12K | 1.19M |
| Resistance Values (3 Days) | | | |
| 1 hit | 10.51M | 2.93M | 13.48M |
| 2 hits | 1.71M | 251.72K | 0.875M |
| Resistance Values (4 Days) | | | |
| 1 hit | 5.31M | 1.782M | 7.32M |
| 2 hits | 0.473M | 212.55K | 0.862M |
| Resistance Values (7 Days) | | | |
| 1 hit | 3.97M | .942M | 6.92M |
| 2 hits | 475.41K | 123.86K | 0.843M |
| Resistance Values (11 Days) | | | |
| 1 hit | 3.62M | 394.26K | 4.13M |
| 2 hits | 148.72K | 26.51K | 0.836M |

Response Key: M = megaohm, K = kilohm

Table 3 indicates that the hybrid offset conductive ink composition of Example 2B exhibits increased conductivity with single and multiple print layers, and increased conductivity upon aging when compared to 100% oxidative curable ink and 100% energy curable conductive ink according to Example 1.

Table 4 shows the resistance values for Example 2C and Example 2D, which is a hybrid offset conductive ink composition according to the present invention containing a 25:75 blend of the oxidative curable ink to the conductive ink of Example 1, also printed on an uncoated side of 0.078 pt SBS board.

TABLE 4

|  | Example 2C (inventive) | Example 2D (inventive) |
|---|---|---|
| Oxidative curable ink | 0 | 25 |
| Conductive ink of Example 1 | 100 | 75 |
| Total | 100 | 100 |
| 1 Print Layer | | |
| Ink Density | 1.27 | 1.27 |
| Resistance Values (1 Hr.) | 16.47K | 16.83K |
| Resistance Values (24 Hr.) | 12.92K | 10.61K |
| 2 Print Layers | | |
| Ink Density | 1.63 | 1.42 |
| Resistance Values (1 Hr.) | 9.83K | 7.98K |
| Resistance Values (24 Hr.) | 4.86K | 3.11K |

The prints were prepared as above, the only difference being that the coated side of the 0.078 pt. SBS board was used.

Table 4 shows that the hybrid ink compositions of the present invention exhibits reduced resistance (improved conductivity) vs. the conductive inks of Example 1.

The present invention has been described in detail, including the preferred embodiments thereof. However, it will be appreciated that those skilled in the art, upon consideration of the present disclosure, may make modifications and/or improvements on this invention that fall within the scope and spirit of the invention.

What is claimed is:

1. An energy curable offset conductive ink comprising:
   at least one oligomer selected from a fatty acid modified polyester hexaacrylate and a combination of a fatty acid modified polyester hexaacrylate and an epoxidized soya oil acrylate oligomer;
   at least one monomer;
   at least one conductive pigment;
   optionally at least one photoinitiator; and
   optionally at least one dispersant and wherein the ink is an energy curable offset ink with a dynamic viscosity of at least 40 Pa·s.

2. The conductive ink according to claim 1 comprising between 10 to 75 wt % of the at least one oligomer.

3. The conductive ink according to claim 1 comprising between 25 to 40 wt % of the at least one monomer or between 10 to 35 wt % of the at least one monomer.

4. The conductive ink according to claim 1 comprising between 5 to 40 wt % of the at least one conductive pigment.

5. The conductive ink according to claim 1 comprising between 0.5 to 25 wt % of at least one photoinitiator.

6. The conductive ink according to claim 1 comprising between 0.5 to 3 wt % of at least one dispersant.

7. The conductive ink according to claim 1 wherein the at least one oligomer is a fatty acid modified polyester hexaacrylate, are epoxidized soya oil acrylate oligomer or a fatty acid modified polyester hexaacrylate and an epoxidized soya oil acrylate oligomer.

8. The conductive ink according to claim 1 wherein the at least one monomer is a monofunctional ethylenically unsaturated monomer or a polyfunctional ethylenically unsaturated monomer.

9. The conductive ink according to claim 8 wherein the at least one monomer is propoxylated neopentyl glycol (meth) acrylate, a propoxylated neopentyl glycol diacrylate (PONPGDA), dipentaerythritol pentaacrylate or propoxylated neopentyl glycol diacrylate and dipentaerythritol pentaacrylate.

10. The conductive ink according to claim 1 wherein the conductive pigment comprises carbon, silver, gold, palladium, aluminum and/or carbon black.

11. The conductive ink according to claim 6 wherein the at least one dispersant is polyester based.

12. The conductive ink according to claim 1 further comprising one or more additives selected from the group consisting of adhesion promoters, light stabilizers, de-gassing additives, flow promoters, defoamers, antioxidants, UV stabilizers, surfactants, plasticizers, rheological additives, waxes, and silicones.

13. The conductive ink according to claim 1 having a dynamic viscosity of between 40 to 100 Pa·s.

14. A hybrid offset conductive ink composition comprising:
   a) an oxidative curable ink and
   b) the energy curable offset conductive ink according to claim 1.

15. The hybrid offset conductive ink composition according to claim 14 comprising up to 35 wt % of the energy curable offset conductive ink and/or up to 35 wt % of the oxidative curable ink.

16. The hybrid offset conductive ink composition according to claim 14 wherein the ratio of energy curable offset conductive ink to oxidative curable ink is 5:95, 10:90, 20:80, 30:70, 40:60, 50:50, 60:40, 70:30, 80:20, 90:10 or 95:5.

17. A substrate comprising an energy curable offset conductive ink comprising at least one oligomer; at least one monomer; at least one conductive pigment; optionally at least one photoinitiator; and optionally at least one dispersant and wherein the ink is an energy curable offset ink with a dynamic viscosity of at least 40 Pa·s, or a hybrid offset conductive ink composition according to claim 14 on a surface of the substrate.

18. The substrate according to claim 17 wherein the substrate is selected from paper, board, metal, wood and plastic.

19. A substrate according to claim 17 wherein the energy curable offset conductive ink is printed thereon as an electronic component.

20. A substrate according to claim 19 wherein the electronic component printed on substrate comprises a radio frequency identification device (RFID) or a printed antenna.

21. A method of providing a substrate with an energy curable offset conductive ink or a hybrid offset conductive ink composition on a surface thereof comprising:
   a) applying a conductive ink comprising at least one oligomer selected from a fatty acid modified polyester hexaacrylate and a combination of a fatty acid modified polyester hexaacrylate and an epoxidized soya oil acrylate oligomer; at least one monomer; at least one conductive pigment; optionally at least one photoinitiator; and optionally at least one dispersant and wherein the ink is an energy curable offset ink with a dynamic viscosity of at least 40 Pa·s or a composition according to claim 14 onto a surface of the substrate, and
   b) drying the conductive ink or composition.

22. A multi-layer print containing a printed circuit comprising:
- a) at least one layer of a conductive ink comprising at least one oligomer selected from a fatty acid modified polyester hexaacrylate and a combination of a fatty acid modified polyester hexaacrylate and an epoxidized soya oil acrylate oligomer; at least one monomer; at least one conductive pigment; optionally at least one photoinitiator; and optionally at least one dispersant and wherein the ink is an energy curable offset ink with a dynamic viscosity of at least 40 Pa·s;
- b) at least one layer of a hybrid offset conductive ink composition according to claim 14
- c) at least one layer of a colored ink and
- d) at least one layer of graphics.

23. A system comprising:
- a) an information carrier capable of encoding information comprising a dielectric and/or conductive pattern provided by a conductive ink comprising at least one oligomer; at least one monomer; at least one conductive pigment; optionally at least one photoinitiator; and optionally at least one dispersant and wherein the ink is an energy curable offset ink with a dynamic viscosity of at least 40 Pa·s or composition claim 14, and
- b) a detection device capable of decoding information comprising a capacitive touch screen.

\* \* \* \* \*